United States Patent
Furuta (10) Patent No.: US 8,368,438 B2
(45) Date of Patent: Feb. 5, 2013

(54) PHASE LOCKED LOOP CIRCUIT AND CONTROL METHOD THEREOF

(75) Inventor: Manabu Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 26 days.

(21) Appl. No.: 13/041,084

(22) Filed: Mar. 4, 2011

(65) Prior Publication Data

US 2011/0215846 A1    Sep. 8, 2011

(30) Foreign Application Priority Data

Mar. 5, 2010   (JP) .................................. 2010-048964

(51) Int. Cl.
*H03L 7/06* (2006.01)

(52) U.S. Cl. ...................... 327/156; 327/147

(58) Field of Classification Search .................. 327/147, 327/156

See application file for complete search history.

(56) References Cited

U.S. PATENT DOCUMENTS

| 2008/0063131 | A1 | 3/2008 | Furuta |
| 2008/0122977 | A1* | 5/2008 | Miyamoto .................... 348/537 |
| 2008/0136531 | A1* | 6/2008 | Kim et al. ....................... 331/2 |
| 2008/0265998 | A1* | 10/2008 | Wood ................................ 331/2 |
| 2011/0215846 | A1* | 9/2011 | Furuta ........................... 327/148 |

FOREIGN PATENT DOCUMENTS

JP       2008-60895 A    3/2008

* cited by examiner

*Primary Examiner* — Adam Houston
(74) *Attorney, Agent, or Firm* — Sughrue Mion, PLLC (57) ABSTRACT

A phase locked loop circuit according to the present invention includes a selector that selects an input clock, a 1/m frequency divider that divides a frequency of the input clock, a 1/n frequency divider that divides a frequency of a feedback clock, a phase difference detector, a first voltage controlled oscillator that includes a first voltage holding circuit, a second voltage controlled oscillator that includes a second voltage holding circuit, and a selection circuit that outputs any output of the first and second voltage controlled oscillators as an output clock and outputs any output of the first and second voltage controlled oscillators as a feedback clock. The input clock is switched when the voltage controlled oscillator in a holding mode generates the output clock and the voltage controlled oscillator in a normal mode generates the feedback clock.

12 Claims, 7 Drawing Sheets

PHASE LOCKED LOOP CIRCUIT AND CONTROL METHOD THEREOF

CROSS-REFERENCE TO RELATED APPLICATIONS

This application is based upon and claims the benefit of priority from Japanese patent application No. 2010-48964, filed on Mar. 5, 2010, the disclosure of which is incorporated herein in its entirety by reference.

BACKGROUND

The present invention relates to a phase locked loop circuit and a control method thereof.

A PLL (Phase Locked Loop) circuit, which generates an output clock in synchronization with an input clock, has been known widely.

In an LSI (Large scale integration) for mobile applications in particular, a PLL circuit may commonly use an original vibration oscillator for generating an input clock with other circuits for the purpose of reducing power consumption. Further, the PLL circuit may selectively use one of a plurality of original vibration oscillators that is operated.

As stated above, the operation of the PLL circuit is typically stopped during a period in which the input clock supplied to the PLL circuit is switched. In this case, however, it is also required to stop the operation of a circuit connected to a subsequent stage of the PLL circuit. Hence, it is required to design the circuit connected to the subsequent stage of the PLL circuit such that even the stop of the PLL circuit does not cause any problem. In order to avoid such a situation, a PLL circuit has been required that is capable of generating an output clock with maintained desired frequency without stopping the operation even when the input clock is switched.

Figure 6:
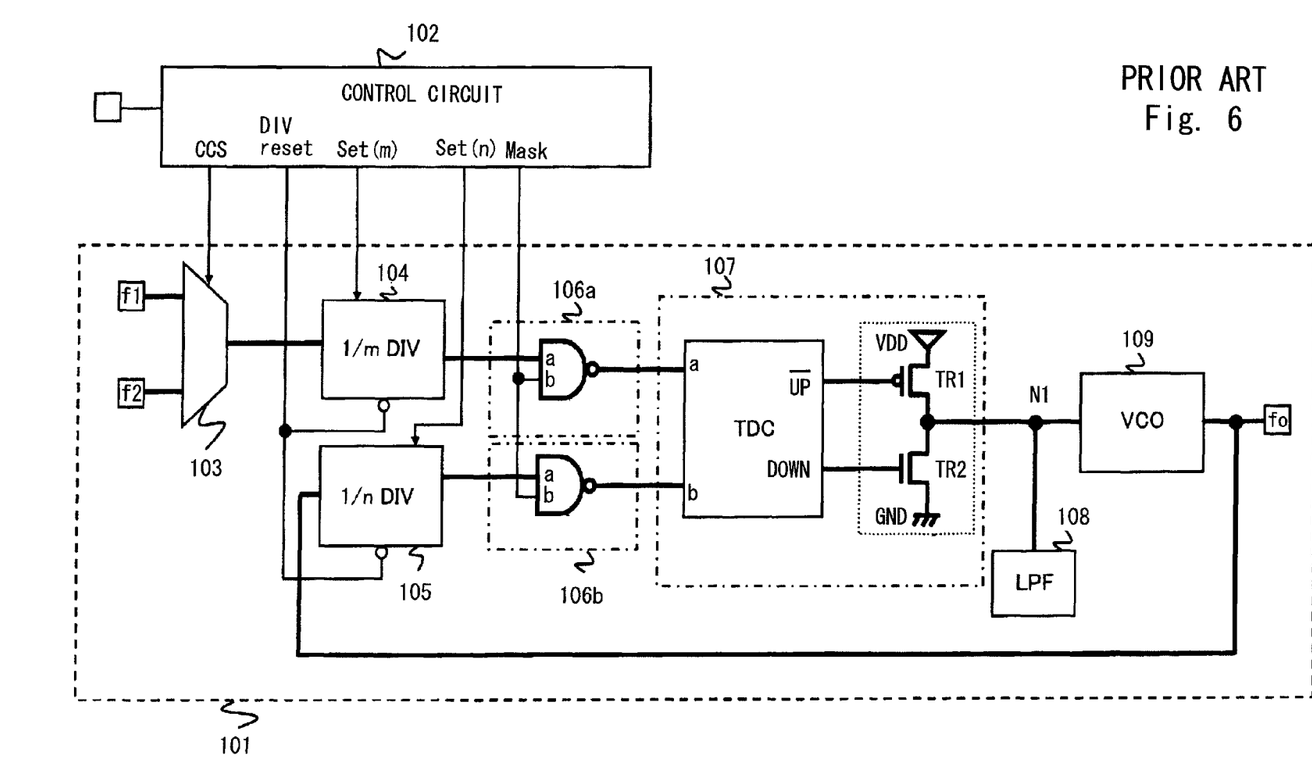
FIG. 6 is a block diagram showing a phase locked loop circuit according to a related art.

One solution to meet this demand is disclosed in Japanese Unexamined Patent Application Publication No. 2008-60895. FIG. 6 shows a PLL circuit (phase locked loop circuit) 101 disclosed in Japanese Unexamined Patent Application Publication No. 2008-60895. As shown in FIG. 6, the PLL circuit 101 includes a selector 103, a 1/m frequency divider 104, a 1/n frequency divider 105, switch circuits 106a and 106b, a phase difference detector 107, a low-pass filter 108, and a voltage controlled oscillator 109. Further, a control circuit 102 is also shown in FIG. 6.

In the PLL circuit 101, a switching operation of an input clock is controlled based on each control signal supplied from the control circuit 102. The selector 103 selects one of a clock f1 and a clock f2 as an input clock, and outputs the selected clock to the 1/m frequency divider 104. The 1/m frequency divider 104 outputs a first frequency divided clock that is obtained by dividing the input clock to the switch circuit 106a. The switch circuit 106a outputs one of a constant voltage and an inverting signal of the first frequency divided clock that is selected based on a control signal Mask to the phase difference detector 107. The 1/n frequency divider 105 outputs a second frequency divided clock obtained by dividing an output clock fo generated by the voltage controlled oscillator 109 to the switch circuit 106b. The switch circuit 106b outputs one of the constant voltage and an inverting signal of the second frequency divided clock that is selected based on the control signal Mask to the phase difference detector 107. The phase difference detector 107 generates a current based on the phase difference of the two input signals. The low-pass filter 108 generates a voltage (voltage of the node N1) according to the current output from the phase difference detector 107. Then the voltage controlled oscillator 109 generates the output clock fo of the frequency based on the voltage of the node N1.

In the PLL circuit 101, when the input clock is switched, the switch circuits 106a and 106b are first set to output a predetermined voltage to the phase difference detector 107. Thus, the voltage variation in the node N1 is suppressed. In this state, the input clock is switched by the selector 103. Further, in this state, the 1/m frequency divider 104 and the 1/n frequency divider 105 are reset, and the frequency dividing ratios of the 1/m frequency divider 104 and the 1/n frequency divider 105 are changed to the ratios that correspond to the input clock after switching. Accordingly, it is possible to switch the input clock while keeping the voltage controlled oscillator 109 self-running state and keeping the state in which disturbance of the waveform of the output clock fo is suppressed. Accordingly, the PLL circuit 101 generates the stable output clock fo with maintained desired frequency without stopping the operation even when the input clock is switched.

SUMMARY

Figure 7:
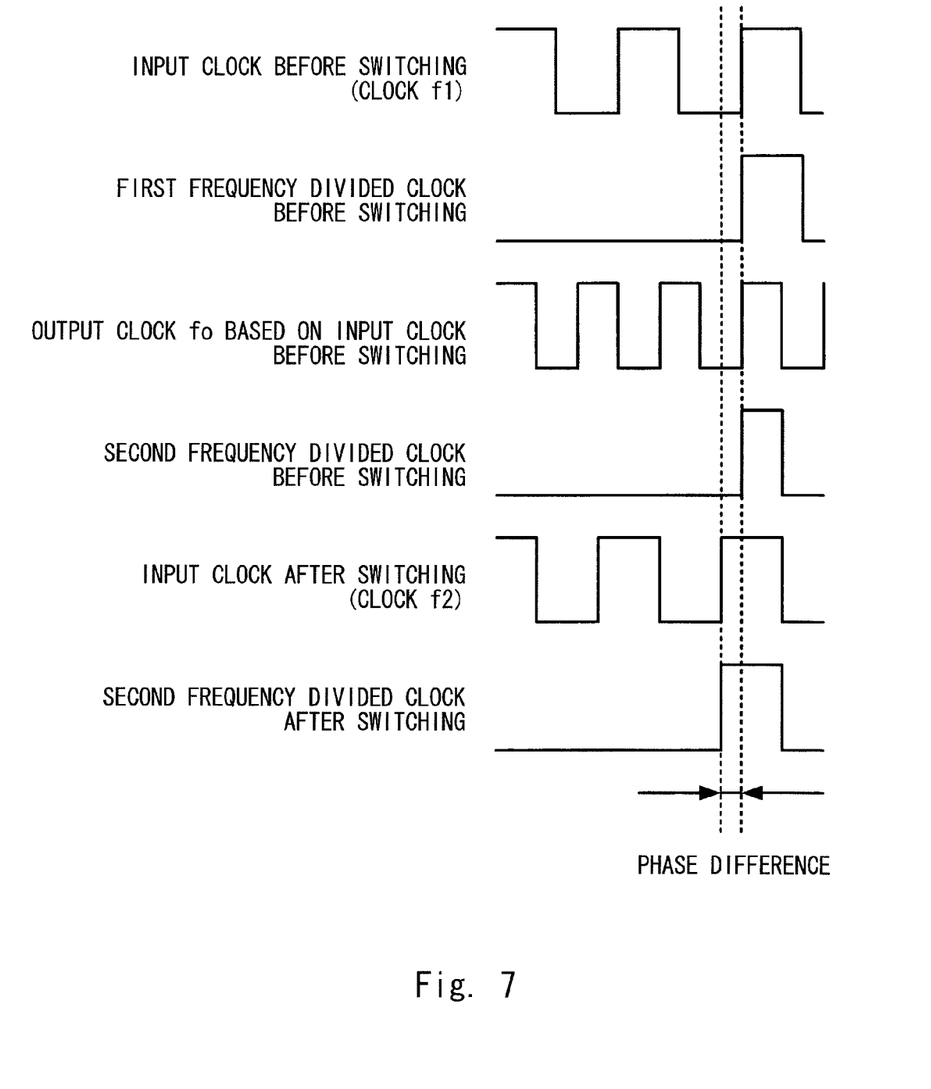
FIG. 7 shows waveforms when an input clock of the phase locked loop circuit according to the related art is switched.

However, the clock f1 and the clock f2 that are used as the input clock are not synchronized. Thus, in the case of the PLL circuit according to the related art, as shown in FIG. 7, there is produced a phase difference between the input clock after switching (e.g., clock f2) and the output clock fo generated based on the input clock before switching (e.g., clock f1) when the input clock is switched (e.g., switch from the clock f1 to the clock f2). In accordance therewith, there is produced a phase difference between the first frequency divided clock and the second frequency divided clock. Accordingly, the PLL circuit according to the related art makes the output clock unstable until when the first frequency divided clock and the second frequency divided clock are locked (synchronized) again.

A first aspect of the present invention is a phase locked loop circuit including: a selector that selects one of a plurality of clocks as an input clock; a first frequency divider that divides a frequency of the input clock; a second frequency divider that divides a frequency of a feedback clock; a phase difference detector that detects a phase difference between the clock divided by the first frequency divider and the clock divided by the second frequency divider; a first voltage controlled oscillator that includes a first voltage holding circuit holding an input voltage according to the phase difference, the first voltage controlled oscillator generating a first intermediate clock based on the input voltage according to the phase difference detected by the phase difference detector in a normal mode, the first voltage controlled oscillator generating the first intermediate clock based on the input voltage held in the first voltage holding circuit in a holding mode; a second voltage controlled oscillator that includes a second voltage holding circuit holding an input voltage according to the phase difference, the second voltage controlled oscillator generating a second intermediate clock based on the input voltage according to the phase difference detected by the phase difference detector in the normal mode, the second voltage controlled oscillator generating the second intermediate clock based on the input voltage held in the second voltage holding circuit in the holding mode; and a selection circuit that selects one of the first and second intermediate clocks, and outputs the selected clock as an output clock and the feedback clock, in which the clock selected as the input clock is switched by the selector when the intermediate clock generated by the voltage controlled oscillator in the holding mode among the first and second intermediate clocks is output as the output clock and the intermediate clock generated by the voltage controlled oscillator in the normal mode is output as the feedback clock.

A second aspect of the present invention is a control method of a phase locked loop circuit, the phase locked loop circuit including: a selector that selects one of a plurality of clocks as an input clock; a first frequency divider that divides a frequency of the input clock; a second frequency divider that divides a frequency of a feedback clock; a phase difference detector that detects a phase difference between the clock divided by the first frequency divider and the clock divided by the second frequency divider; a first voltage controlled oscillator that includes a first voltage holding circuit holding an input voltage according to the phase difference, the first voltage controlled oscillator generating a first intermediate clock based on the input voltage according to the phase difference detected by the phase difference detector in a normal mode, the first voltage controlled oscillator generating the first intermediate clock based on the input voltage held in the first voltage holding circuit in a holding mode; a second voltage controlled oscillator that includes a second voltage holding circuit holding an input voltage according to the phase difference, the second voltage controlled oscillator generating a second intermediate clock based on the input voltage according to the phase difference detected by the phase difference detector in the normal mode, the second voltage controlled oscillator generating the second intermediate clock based on the input voltage held in the second voltage holding circuit in the holding mode; and a selection circuit that selects one of the first and second intermediate clocks, and outputs the selected clock as an output clock and the feedback clock, the control method including: outputting the intermediate clock generated by the voltage controlled oscillator in the holding mode among the first and second intermediate clocks as the output clock; outputting the intermediate clock generated by the voltage controlled oscillator in a normal mode as the feedback clock; and switching the clock selected as the input clock by the selector.

According to the circuit configuration as stated above, it is possible to generate stable output clock when the input clock is switched.

The present invention provides a phase locked loop circuit that is capable of generating stable output clock when the input clock is switched.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

The first and second embodiments can be combined as desirable by one of ordinary skill in the art.

Hereinafter, embodiments of the present invention will be described with reference to the drawings. Since the drawings are simplified, the technical scope of the present invention should not be narrowly interpreted on the basis of the drawings. The same components throughout the drawings are denoted by the same reference symbols, and overlapping description will be omitted.

First Embodiment

Figure 1:
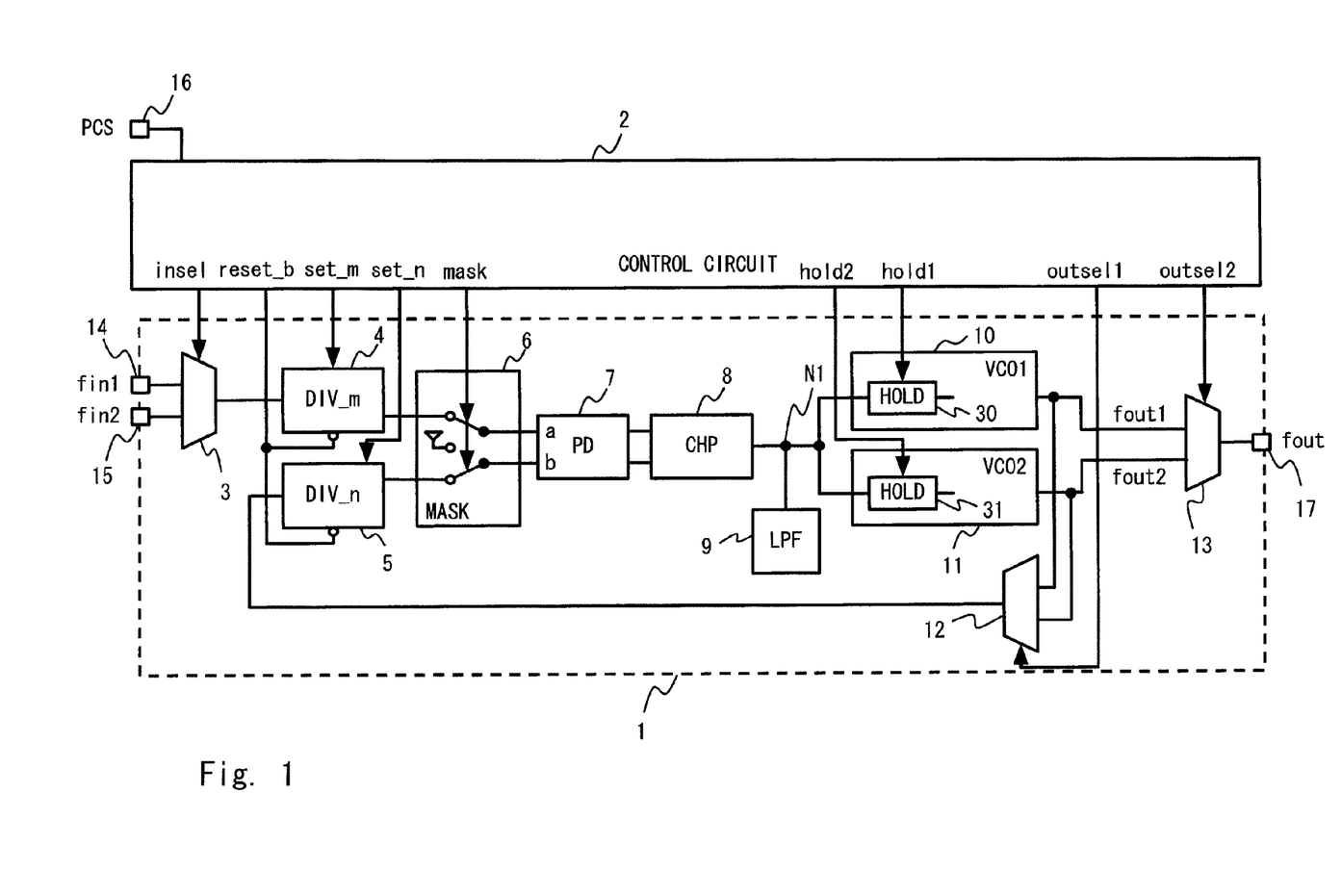
FIG. 1 is a block diagram showing a phase locked loop circuit according to a first embodiment of the present invention.

FIG. 1 shows a block diagram of a PLL circuit (phase locked loop circuit) 1 according to a first embodiment of the present invention. A control circuit 2 is also shown in FIG. 1.

As shown in FIG. 1, the PLL circuit 1 includes a selector 3, a 1/m frequency divider (DIV_m; first frequency divider) 4, a 1/n frequency divider (DIV_n; second frequency divider) 5, a mask circuit (MASK) 6, a timing detection circuit (PD) 7, a charge pump (CHP) 8, a low-pass filter (LPF) 9, a voltage controlled oscillator (VCO1; first voltage controlled oscillator) 10, a voltage controlled oscillator (VCO2; second voltage controlled oscillator) 11, a selector 12, and a selector 13. Note that the timing detection circuit 7 and the charge pump 8 constitute a phase difference detector. Further, the selector 12 and the selector 13 constitute a selection circuit.

The PLL circuit 1 switches selection of a clock selected as an input clock based on a control signal insel among control signals supplied from the control circuit 2. The control circuit 2 generates control signals insel, reset_b, set_m, set_n, mask, hold1, hold2, outsel1, and outsel2 based on a "phase change signal (PCS)" supplied from a control port 16. The signals insel, reset_b, set_m, set_n, mask, hold1, hold2, outsel1, and outsel2 generated by the control circuit 2 are supplied to the PLL circuit 1 in a predetermined order and at a predetermined timing.

(Selector 3)

A clock fin1 is supplied to the selector 3 from a first input port 14. Further, a clock fin2 is supplied to the selector 3 from a second input port 15. The selector 3 selects one of the clock fin1 and the clock fin2 as an input clock based on the control signal insel supplied from the control circuit 2. For example, when the control signal insel is a low-level signal (L), the selector 3 selects and outputs the clock fin1; when the control signal insel is a high-level signal (H), the selector 3 selects and outputs the clock fin2. The input clock selected by the selector 3 is supplied to the 1/m frequency divider 4.

(1/m Frequency Divider 4)

The 1/m frequency divider 4 is provided between the selector 3 and the mask circuit 6. The 1/m frequency divider 4 divides the frequency of the input clock supplied from the selector 3, and outputs the clock (first frequency divided clock) fa obtained by dividing the frequency to one input terminal of the mask circuit 6. The 1/m frequency divider 4 is formed of a so-called counter.

The count state of the 1/m frequency divider 4 is reset by the control signal reset_b supplied from the control circuit 2. Further, the frequency dividing ratio in the 1/m frequency divider 4 is set by the control signal set_m supplied from the control circuit 2. In the first embodiment, when the control signal set_m is in the low level, a frequency dividing ratio m1 (m1 is a natural number) is set in the 1/m frequency divider 4.

On the other hand, when the control signal set_m is in the high level, a frequency dividing ratio m2 (m2 is a natural number) is set in the 1/m frequency divider 4.

(1/n Frequency Divider 5)

The 1/n frequency divider 5 is provided between the mask circuit 6 and the selector 12 that will be described below. The 1/n frequency divider 5 divides the frequency of one output clock (feedback clock) that is selected from an output clock output from the voltage controlled oscillator 10 (first intermediate clock) fout1 and an output clock output from the voltage controlled oscillator 11 (second intermediate clock) fout2, and outputs the clock (second frequency divided clock) fb obtained by dividing the frequency. Note that the 1/n frequency divider 5 is formed of a counter in the similar way as the 1/m frequency divider 4.

The count state of the 1/n frequency divider 5 is reset by the control signal reset_b supplied from the control circuit 2. Further, the frequency dividing ratio in the 1/n frequency divider 5 is set by the control signal set_n supplied from the control circuit 2. In the first embodiment, when the control signal set_n is in the low level, a frequency dividing ratio n1 (n1 is a natural number) is set in the 1/n frequency divider 5. On the other hand, when the control signal set_n is in the high level, a frequency dividing ratio n2 (n2 is a natural number) is set in the 1/n frequency divider 5.

When the clock fin1 is used as the input clock, the frequency dividing ratio m1 is set in the 1/m frequency divider 4 and the frequency dividing ratio n1 is set in the 1/n frequency divider 5. On the other hand, when the clock fin2 is used as the input clock, the frequency dividing ratio m2 is set in the 1/m frequency divider 4 and the frequency dividing ratio n2 is set in the 1/n frequency divider 5. Further, the frequency dividing ratios of the 1/m frequency divider 4 and the 1/n frequency divider 5 are set such that the frequency of an output clock fout is kept to a desired frequency before and after the switch of the input clock.

(Mask Circuit 6)

The mask circuit 6 includes, for example, two switch circuits 6a and 6b. The clock fa output from the 1/m frequency divider 4 is supplied to the switch circuit 6a before being supplied to an input terminal a of the timing detection circuit 7 described below. Further, the clock fb output from the 1/n frequency divider 5 is supplied to the switch circuit 6b before being supplied to an input terminal b of the timing detection circuit 7 described below.

By using the configuration as above, it is possible to suppress occurrence of the disturbance in the waveform of the output clock fout output from an output port 17 of the PLL circuit 1 even when "phase switch", which means the switch of the clock selected as the input clock, is performed. In summary, the PLL circuit 1 is capable of generating the stable output clock with maintained desired frequency without stopping the operation even when the input clock is switched. This point will also be made clear from the description stated below.

The first embodiment will be described taking a case in which the switch circuit 6a is a NAND 20 (not shown) as an example. Further, the first embodiment will be described taking a case in which the switch circuit 6b is a NAND 21 (not shown) as an example. The NANDs 20 and 21 are logic circuits each having two inputs and one output.

The NAND 20 has one input terminal connected to an output terminal of the 1/m frequency divider 4, and supplied with the clock fa divided by the 1/m frequency divider 4. The NAND 20 has the other input terminal connected to the control circuit 2 and supplied with the inverting signal of the control signal mask from the control circuit 2.

The output state of the NAND 20 is determined based on the control signal mask supplied from the control circuit 2. More specifically, when the control signal mask is the low-level voltage, the NAND 20 inverts the clock fa output from the 1/m frequency divider 4 and outputs the inverted signal. When the control signal mask is the high-level voltage, the NAND 20 constantly outputs the high-level signal.

In summary, the switch circuit 6a selectively outputs one of the clock fa divided by the 1/m frequency divider 4 and the high-level voltage signal (substantially constant voltage) to the input terminal a of the timing detection circuit 7 based on the control signal mask supplied from the control circuit 2.

The configuration of the switch circuit 6b is equal to that of the switch circuit 6a. In other words, the NAND 21 forming the switch circuit 6b corresponds to the NAND 20 forming the switch circuit 6a.

Note that the NAND 21 has one input terminal connected to an output terminal of the 1/n frequency divider 5 and supplied with the clock fb divided by the 1/n frequency divider 5. The NAND 21 has the other input terminal connected to the control circuit 2 and supplied with the inverting signal of the control signal mask from the control circuit 2.

The output state of the NAND 21 is determined based on the control signal mask supplied from the control circuit 2 as is similar to the NAND 20. More specifically, when the control signal mask is the low-level voltage signal, the NAND 21 inverts the clock fb output from the 1/n frequency divider 5 and outputs the inverted signal. When the control signal mask is the high-level voltage signal, the NAND 21 constantly outputs the high-level voltage signal.

In summary, the switch circuit 6b selectively outputs one of the clock fb divided by the 1/n frequency divider 5 and the high-level voltage signal (substantially constant voltage) to the input terminal b of the timing detection circuit 7 based on the control signal mask supplied from the control circuit 2.

(Timing Detection Circuit 7)

The timing detection circuit 7 is a logic circuit having two inputs and two outputs. The timing detection circuit 7 has an input terminal a connected to the output terminal of the switch circuit 6a. The timing detection circuit 7 has an input terminal b connected to the output terminal of the switch circuit 6b. The timing detection circuit 7 has an output terminal UPbar connected to one input terminal (first control terminal) of the charge pump 8 described below. The timing detection circuit 7 also has an output terminal DOWN connected to the other input terminal (second control terminal) of the charge pump 8 described below.

Upon detection of the falling of the clock supplied to the input terminal a, the timing detection circuit 7 changes a voltage signal (first timing signal) output from the output terminal UPbar from the high level to the low level. Further, upon detection of the rising of the clock supplied to the input terminal a, the timing detection circuit 7 changes the first timing signal from the low level to the high level.

Upon detection of the falling of the clock supplied to the input terminal b, the timing detection circuit 7 changes a voltage signal (second timing signal) output from the output terminal DOWN from the low level to the high level. Further, upon detection of the rising of the clock supplied to the input terminal b, the timing detection circuit 7 changes the second timing signal from the high level to the low level.

(Charge Pump 8)

The charge pump 8 includes, for example, a P-type MOS transistor TR1 (not shown) and an N-type MOS transistor TR2 (not shown) that are connected in series at an output stage. The source of the TR1 is connected to a power supply potential (VDD). The gate of the TR1 (first control terminal)

is connected to the output terminal UPbar of the timing detection circuit 7. The drain of the TR1 is connected to the drain of the TR2. The gate of the TR2 (second control terminal) is connected to the output terminal DOWN of the timing detection circuit 7. The source of the TR2 is connected to a ground potential (GND).

The charge pump 8 generates a current (phase difference current) according to a phase difference between the clock divided by the 1/m frequency divider 4 and the clock divided by the 1/n frequency divider 5. The operation of the charge pump 8 will be described later with reference to FIG. 2.

(Low-Pass Filter 9)

As shown in FIG. 1, the low-pass filter 9 is connected in parallel with a node N1 between the timing detection circuit 7 and the voltage controlled oscillators 10 and 11 described later. The low-pass filter 9 includes at least one capacitor.

Upon generation of the current (phase difference current) according to the phase difference between the clock fa divided by the 1/m frequency divider 4 and the clock fb divided by the 1/n frequency divider 5 by the charge pump 8, the capacitor included in the low-pass filter 9 is charged or discharged. A voltage Vin in the node N1 varies based on the charge or discharge of the capacitor included in the low-pass filter 9. Hence, the frequency of the output clock fout1 of the voltage controlled oscillator 10 in a normal mode is adjusted. In the similar way, the frequency of the output clock fout2 of the voltage controlled oscillator 11 in the normal mode is adjusted. Note that the voltage Vin in the node N1 corresponds to an input voltage of the voltage controlled oscillators 10 and 11.

(Voltage Controlled Oscillator 10)

As shown in FIG. 1, the voltage controlled oscillator 10 has an input terminal connected to the charge pump 8 and the low-pass filter 9, and an output terminal connected to one input terminal of each of the selectors 12 and 13 described below. The output clock fout1 output from the voltage controlled oscillator 10 is supplied to one input terminal of each of the selectors 12 and 13.

Further, the voltage controlled oscillator 10 includes a voltage holding circuit (HOLD; first voltage holding circuit) 30. The voltage holding circuit 30 has an input terminal connected to the charge pump 8 and the low-pass filter 9, and an output terminal connected to a subsequent internal circuit (not shown) in the voltage controlled oscillator 10. The voltage controlled oscillator 10 controls whether to hold the previous voltage Vin in the node N1 based on the control signal hold1 supplied from the control circuit 2. For example, when the control signal hold1 is in the high level (holding mode), the voltage holding circuit 30 holds the previous voltage Vin in the node N1, and outputs the voltage Vin to the subsequent internal circuit. On the other hand, when the control signal hold1 is in the low level (normal mode), the voltage holding circuit 30 directly outputs the input voltage Vin to the subsequent internal circuit without holding the previous voltage Vin of the node N1.

The voltage controlled oscillator 10 outputs the output clock fout1 of the frequency according to the voltage level of the voltage output from the voltage holding circuit 30. For example, when the control signal hold1 is in the high level, the voltage controlled oscillator 10 outputs the output clock fout1 of the frequency according to the voltage level of a fixed voltage held in the voltage holding circuit 30. On the other hand, when the control signal hold1 is in the low level, the voltage controlled oscillator 10 outputs the output clock fout1 of the frequency according to the voltage level of the voltage Vin in the node N1. In short, when the control signal hold1 is in the low level and when the voltage level of the voltage Vin in the node N1 becomes lower, the frequency of the output clock fout1 output from the voltage controlled oscillator 10 becomes lower. When the control signal hold1 is in the low level and when the voltage level of the voltage Vin in the node N1 becomes higher, the frequency of the output clock fout1 output from the voltage controlled oscillator 10 becomes higher.

(Voltage Controlled Oscillator 11)

As shown in FIG. 1, the voltage controlled oscillator 11 has an input terminal connected to the charge pump 8 and the low-pass filter 9, and an output terminal connected to the other input terminal of each of the selectors 12 and 13 described below. The output clock fout2 output from the voltage controlled oscillator 11 is supplied to the other input terminal of each of the selectors 12 and 13.

Further, the voltage controlled oscillator 11 includes a voltage holding circuit (HOLD; second voltage holding circuit) 31. The voltage holding circuit 31 has an input terminal connected to the charge pump 8 and the low-pass filter 9, and an output terminal connected to a subsequent internal circuit (not shown) in the voltage controlled oscillator 11. The voltage controlled oscillator 11 controls whether to hold the previous voltage Vin in the node N1 based on the control signal hold2 supplied from the control circuit 2. For example, when the control signal hold2 is in the high level (holding mode), the voltage holding circuit 31 holds the previous voltage Vin in the node N1, and outputs the voltage Vin to the subsequent internal circuit. On the other hand, when the control signal hold2 is in the low level (normal mode), the voltage holding circuit 31 outputs the input voltage Vin directly to the subsequent internal circuit without holding the previous voltage Vin in the node N1.

The voltage controlled oscillator 11 outputs the output clock fout2 having the frequency according to the voltage level of the voltage output from the voltage holding circuit 31. For example, when the control signal hold2 is in the high level, the voltage controlled oscillator 11 outputs the output clock fout2 having the frequency according to the voltage level of a fixed voltage held in the voltage holding circuit 31. On the other hand, when the control signal hold2 is in the low level, the voltage controlled oscillator 11 outputs the output clock fout2 having the frequency according to the voltage level of the voltage Vin in the node N1. In summary, when the control signal hold2 is in the low level and when the voltage level of the voltage Vin in the node N1 is made lower, the frequency of the output clock fout2 output from the voltage controlled oscillator 11 is made lower. When the control signal hold2 is in the low level and when the voltage level of the voltage Vin in the node N1 is made higher, the frequency of the output clock fout2 output from the voltage controlled oscillator 11 is made higher.

By using the two voltage controlled oscillators 10 and 11 as described above, even when "phase switch", which means switching of the clock selected as the input clock, is performed, it is possible to suppress the occurrence of the disturbance in the waveform of the output clock fout output from the output port 17 of the PLL circuit 1. In summary, the PLL circuit 1 is capable of generating the stable output clock with maintained desired frequency without stopping the operation even when the input clock is switched. This point will also be made clear from the description below.

(Selector 12)

As shown in FIG. 1, the selector 12 has one input terminal connected to the output terminal of the voltage controlled oscillator 10, the other input terminal connected to the output terminal of the voltage controlled oscillator 11, and an output terminal connected to the input terminal of the 1/n frequency divider 5. The output clock fout1 output from the voltage controlled oscillator 10 is supplied to one input terminal of the selector 12. The output clock fout2 output from the voltage controlled oscillator 11 is supplied to the other input terminal of the selector 12. Then the selector 12 selects one of the output clock fout1 and the output clock fout2 and outputs the selected clock based on the control signal outsel1 supplied from the control circuit 2. For example, when the control signal outsel1 is the low-level signal (L), the selector 12 selects and outputs the output clock fout1. On the other hand, when the control signal outsel1 is the high-level signal (H), the selector 12 selects and outputs the output clock fout2. The output clock selected by the selector 12 is supplied to the 1/n frequency divider 5.

(Selector 13)

As shown in FIG. 1, the selector 13 has one input terminal connected to the output terminal of the voltage controlled oscillator 10, the other input terminal connected to the output terminal of the voltage controlled oscillator 11, and an output terminal connected to the output port 17. The output clock fout1 output from the voltage controlled oscillator 10 is supplied to one input terminal of the selector 13. The output clock fout2 output from the voltage controlled oscillator 11 is supplied to the other input terminal of the selector 13. The selector 13 selects one of the output clock fout1 and the output clock fout2 based on the control signal outsel2 supplied from the control circuit 2, and outputs the selected clock as the output clock fout. For example, when the control signal outsel1 is the low-level signal (L), the selector 13 selects the output clock fout1 and outputs the output clock fout1 as the output clock fout. On the other hand, when the control signal outsel1 is the high-level signal (H), the selector 12 selects the output clock fout2 and outputs the output clock fout2 as the output clock fout.

Now, operations of the charge pump 8 will be described with reference to FIG. 2.

Figure 2:
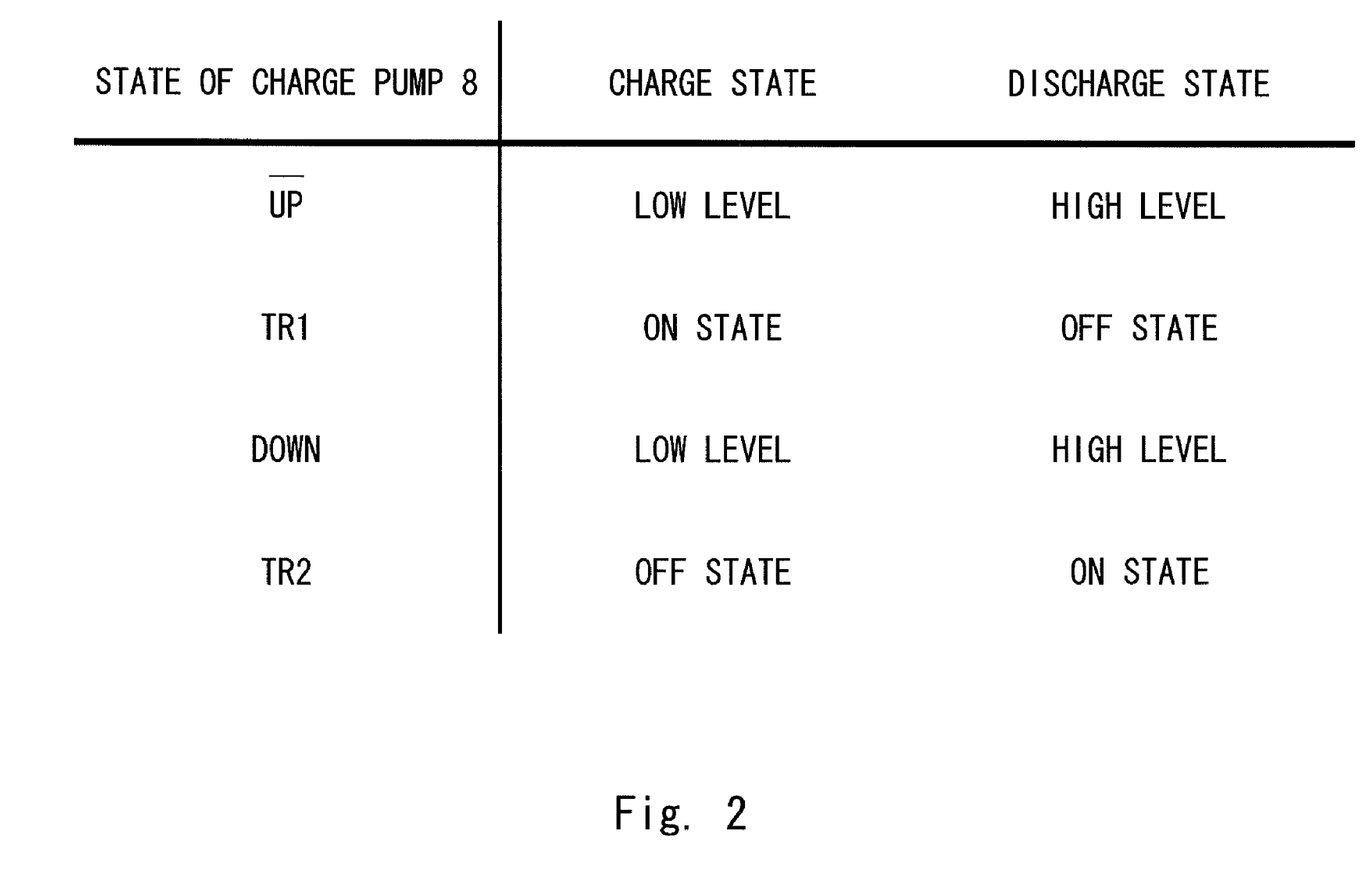
FIG. 2 is a diagram describing an operation of a charge pump 8.

As shown in FIG. 2, when the first timing signal output from the output terminal UPbar of the timing detection circuit 7 is in the low level and the second timing signal output from the output terminal DOWN is in the low level, the charge pump 8 is in the "charge state". In summary, when the first timing signal is in the low level, the TR1 is in the ON state; when the second timing signal is in the low level, the TR2 is in the OFF state. Then, the current is supplied from the charge pump 8 to the low-pass filter 9. In other words, the capacitor included in the low-pass filter 9 is charged by the current generated in the charge pump 8.

When the second timing signal changes to the high level in this state, the timing detection circuit 7 is in the reset state. Thus, when the charge pump 8 is in the "charge state", the current input from the charge pump 8 to the low-pass filter 9 corresponds to a phase difference current according to the phase difference between the clock fa divided by the 1/m frequency divider 4 and the clock fb divided by the 1/n frequency divider 5. More specifically, it is the current that reflects the phase delay amount of the output clock fout1 when the control signal hold1 is in the low level. Otherwise, it is the current that reflects the phase delay amount of the output clock fout2 when the control signal hold2 is in the low level.

Further, as shown in FIG. 2, when the first timing signal is in the high level and the second timing signal is in the high level, the charge pump 8 is in the "discharge state". In summary, when the first timing signal is in the high level, the TR1 is in the OFF state; when the second timing signal is in the high level, the TR2 is in the ON state. Then, a current is supplied from the low-pass filter 9 to the charge pump 8. In other words, a current is supplied from the capacitor included in the low-pass filter 9 to the charge pump 8, and the current is generated in the charge pump 8.

When the first timing signal changes to the low level in this state, the timing detection circuit 7 is in the reset state. Hence, when the charge pump 8 is in the "discharge state", the current input to the low-pass filter 9 from the charge pump 8 corresponds to a phase difference current according to the phase difference between the clock divided by the 1/m frequency divider 4 and the clock divided by the 1/n frequency divider 5. Specifically, it is the current that reflects the phase advance amount of the output clock fout1 when the control signal hold1 is in the low level. Otherwise, it is the current that reflects the phase advance amount of the output clock fout2 when the control signal hold2 is in the low level.

Figure 3:
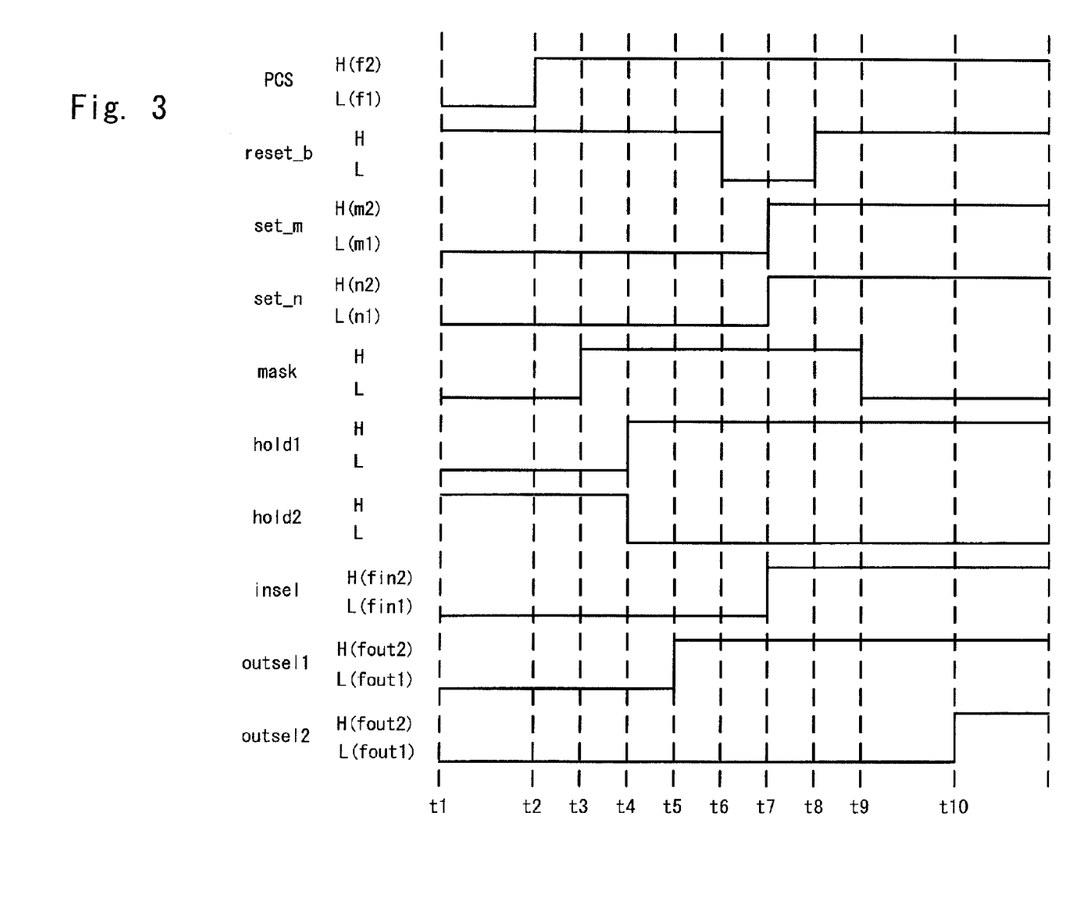
FIG. 3 is a timing chart showing an operation of the phase locked loop circuit according to the first embodiment of the present invention.

(Timing Chart)

Operations of switching clocks used as an input clock (phase switch) will be described with reference to FIG. 3. Described in the example shown in FIG. 3 is a case in which the clock used as the input clock is switched from the clock fin1 to the clock fin2.

From time t1 to t2 before phase switching, the clock fa divided by the 1/m frequency divider 4 is supplied to the input terminal a of the timing detection circuit 7 after being inverted by the switch circuit 6a (not shown). Further, the clock fb divided by the 1/n frequency divider 5 is supplied to the input terminal b of the timing detection circuit 7 after being inverted by the switch circuit 6b (not shown).

At this time, since the control signal hold1 is in the low level, the voltage controlled oscillator 10 shows the operation in the normal mode. In summary, the voltage controlled oscillator 10 outputs the output clock fout1 having the frequency according to the voltage level of the voltage Vin in the node N1. On the other hand, since the control signal hold2 is in the high level, the voltage controlled oscillator 11 shows the operation in the holding mode. In summary, the voltage controlled oscillator 11 outputs the output clock fout2 having the frequency according to the fixed voltage held in the voltage holding circuit 31. Since the control signal insel is in the low level, the selector 3 selects the clock fin1 and outputs the clock fin1 to the 1/m frequency divider 4. Further, since the control signal outsel1 is in the low level, the selector 12 selects the output clock fout1 and outputs the output clock fout1 to the 1/n frequency divider 5. Since the control signal outsel2 is in the low level, the selector 13 selects the output clock fout1 and outputs the output clock fout1 to the output port 17 as the output clock fout. Further, since the control signal set_m is in the low level, the 1/m frequency divider 4 is set to the frequency dividing ratio m1. Since the control signal set_n is in the low level, the 1/n frequency divider 5 is set to the frequency dividing ratio n1.

At time t2, the "phase change signal (PCS)" supplied from the control port 16 to the control circuit 2 is changed from the low level (L) to the high level (H). In accordance therewith, the control circuit 2 generates the control signals insel, reset_b, set_m, set_n, mask, hold1, hold2, outsel1, and outsel2. When the "phase change signal" is in the high level, the clock fin2 is selected; when the "phase change signal" is in the low level, the clock fin1 is selected. Further, since the output clock fout is not switched by the selector 13 at time t2, the PLL circuit 1 continues to output the output clock fout based on the clock fin1 before switching the input clocks.

At time t3, the control signal mask supplied from the control circuit 2 to the other input terminal of the switch circuit 6a and the other input terminal of the switch circuit 6b is changed from the low level (L) to the high level (H). At this time, as described above, the output of the switch circuit 6a is fixed to the high-level voltage signal. In the similar way, the output of the switch circuit 6*b* is also fixed to the high-level voltage signal. The control signal mask is kept high until time t9.

The timing detection circuit 7 detects, as described above, an edge of the clock input to the input terminal a, and an edge of the clock input to the input terminal b. Since input voltages of the input terminal a and the input terminal b are fixed to the high-level voltage signal (substantially constant voltage) as described above, the voltage signal (first timing signal) output from the output terminal UPbar of the timing detection circuit 7 and the voltage signal (second timing signal) output from the output terminal DOWN are not changed. In short, the voltage signal output from the output terminal UPbar of the timing detection circuit 7 is kept to the high level. Further, the voltage signal output from the output terminal DOWN of the timing detection circuit 7 is kept to the low level. Then, both of the TR1 and the TR2 of the charge pump 8 are made OFF. Accordingly, the voltage Vin in the node N1 is fixed to a predetermined voltage level.

At time t4, the control signal hold1 supplied from the control circuit 2 to the voltage holding circuit 30 is changed from the low level (L) to the high level (H). Hence, the voltage holding circuit 30 holds the voltage level of the previous voltage Vin in the node N1. In summary, the voltage holding circuit 30 is switched from the normal mode to the holding mode. The voltage controlled oscillator 10 outputs the output clock fout1 having the frequency according to the voltage level of the fixed voltage held in the voltage holding circuit 30. At the same time, the control signal hold2 supplied from the control circuit 2 to the voltage holding circuit 31 is changed from the high level (H) to the low level (L). In summary, the voltage holding circuit 31 is switched from the holding mode to the normal mode. Then, the voltage holding circuit 31 directly outputs the voltage Vin that receives to the subsequent internal circuit in the voltage controlled oscillator 11. The voltage controlled oscillator 11 outputs the output clock fout2 having the frequency according to the voltage level of the voltage Vin in the node N1.

At time t5, the control signal outsel1 supplied from the control circuit 2 to the selector 12 is changed from the low level (L) to the high level (H). Hence, the selector 12 selects the output clock fout2, and outputs the output clock fout2 to the 1/n frequency divider 5 as the feedback clock. In this case, the control signal outsel2 supplied from the control circuit 2 to the selector 13 keeps the state of the low level (L). Accordingly, the selector 13 keeps the selection of the output clock fout1, and outputs the output clock fout1 to the output port 17 as the output clock fout. In summary, since the output clock fout is not switched by the selector 13 also at time t5, the PLL circuit 1 continues to output the output clock fout based on the clock fin1 before switching the input clock. The PLL circuit 1 continues to output the output clock fout based on the clock fin1 before switching the input clock until time t10. Since the control signal mask is at the high level, phase comparison by the timing detection circuit 7 is not performed. In short, the loop is kept broken.

At time t6, the control signal reset_b supplied from the control circuit 2 to the 1/m frequency divider 4 and the 1/n frequency divider 5 is changed from the high level (H) to the low level (L). In the 1/m frequency divider 4 and the 1/n frequency divider 5, the low-level voltage is supplied to the reset terminal, and the counter value is reset. The control signal reset_b is kept low until time t8.

At time t7, the control signal insel supplied from the control circuit 2 to the selector 3 is changed from the low level (L) to the high level (H). Hence, the selector 3 switches the selection from the clock fin1 to the clock fin2, and outputs the clock fin2 to the 1/m frequency divider 4 as the input clock.

Further, at time t7, the control signal set_m supplied from the control circuit 2 to the 1/m frequency divider 4 is changed from the low level (L) to the high level (H). Hence, the frequency dividing ratio m2 is set in the 1/m frequency divider 4. At the same time, the control signal set_n supplied from the control circuit 2 to the 1/n frequency divider 5 is changed from the low level (L) to the high level (H). Hence, the frequency dividing ratio n2 is set in the 1/n frequency divider 5. In summary, at time t7, the frequency dividing ratio corresponding to the clock fin2 is set in each of the 1/m frequency divider 4 and the 1/n frequency divider 5.

At time t8, the control signal reset_b supplied from the control circuit 2 to the 1/m frequency divider 4 and the 1/n frequency divider 5 is changed from the low level (L) to the high level (H). Hence, the reset state in the 1/m frequency divider 4 and the 1/n frequency divider 5 is cancelled, and at the same time the 1/m frequency divider 4 and the 1/n frequency divider 5 start counting. However, there is produced a phase difference based on the phase difference between the clock fin1 and the clock fin2 between the first frequency divided clock fa output from the 1/m frequency divider 4 and the second frequency divided clock fb output from the 1/n frequency divider 5.

At time t9, the control signal mask supplied from the control circuit 2 to the switch circuits 6*a* and 6*b* is changed from the high level (H) to the low level (L). At the same time, a clock obtained by inverting the first frequency divided clock fa is supplied to the input terminal a of the timing detection circuit 7. Further, a clock obtained by inverting the second frequency divided clock fb is supplied to the input terminal b of the timing detection circuit 7. In short, the masking by the mask circuit 6 is cancelled. Therefore, in the PLL circuit 1, phase comparison by the timing detection circuit 7 is started again, and matching (lock operation) of the phase difference between the first frequency divided clock fa and the second frequency divided clock fb is carried out. At this time, the control signal outsel2 supplied from the control circuit 2 to the selector 13 keeps the state of the low level (L). Therefore, the selector 13 keeps the selection of the output clock fout1 output from the voltage controlled oscillator 10, and outputs the output clock fout1 to the output port 17 as the output clock fout. In summary, the selector 13 outputs the output clock fout1 having the frequency according to the voltage level of the fixed potential held in the voltage holding circuit 30 as the output clock fout. In other words, the PLL circuit 1 continues to output the output clock fout based on the clock fin1 before switching the input clock as stated above.

Then, at time t10 after a predetermined period, the control signal outsel2 supplied from the control circuit 2 to the selector 13 is changed from the low level (L) to the high level (H). Then, the selector 13 selects the output clock fout2 output from the voltage controlled oscillator 11, and outputs the output clock fout2 to the output port 17. In summary, the selector 13 continues to output the output clock fout1 generated based on the clock fin1 before switching the input clock as the output clock fout before completion of the lock operation. Then, the selector 13 outputs the output clock fout2 generated based on the clock fin2 after switching the input clock as the output clock fout after completion of the lock operation. In other words, the selector 13 outputs the stable output clock fout1 as the output clock fout while the operation of the output clock fout2 is not stable, and outputs the output clock fout2 as the output clock fout after the operation of the output clock fout2 is made stable.

According to such a circuit configuration, the variation of the output clock fout2 based on the lock operation is not transferred to the output clock fout. In summary, the PLL circuit 1 is capable of outputting the stable output clock fout with maintained desired frequency without being influenced by the variation of the output clock fout2 based on the lock operation when the input clock is switched.

Note that the operation is performed by the similar procedure as stated above also when the input clock is switched from the clock fin2 to the clock fin1. The operational procedure in such a case will be described with reference to a timing chart shown in FIG. 3. At time t2, the PCS is switched from the high level to the low level. At time t4, the control signal hold1 is switched from the high level to the low level. At the same time, the control signal hold2 is switched from the low level to the high level. At time t5, the control signal outsel1 is switched from the high level to the low level. At time t7, the control signal set_m, the control signal set_n, and the control signal insel are each switched from the high level to the low level. At time t10, the control signal outsel2 is switched from the high level to the low level. The other operational procedure is similar to the case in which the input clock is switched from the clock fin1 to the clock fin2, and thus description will be omitted.

As stated above, the PLL circuit (phase locked loop circuit) 1 according to the first embodiment includes voltage controlled oscillators 10 and 11 including a voltage holding function. Then, the PLL circuit 1 outputs the output clock fout based on the input clock before switching (e.g., clock fin1) until when the lock operation is completed between the feedback clock and the input clock after switching when switching the input clock. Then, the PLL circuit 1 switches the clock to the output clock fout based on the input clock after switching (e.g., clock fin2) and outputs the output clock fout after the completion of the lock operation. Accordingly, the PLL circuit 1 is able to output the stable output clock fout with maintained desired frequency without being influenced by the lock operation when the input clock is switched.

The PLL circuit 1 according to the first embodiment is able to minimize the disturbance of the waveform (only at the timing of switching) even when there is a phase difference between the output clocks fout1 and fout2 when the output clock fout is switched. On the other hand, the PLL circuit according to the related art continues to output the unstable output clocks until when the lock operation between the input clock after switching and the feedback clock is completed. In summary, the PLL circuit according to the first embodiment is capable of outputting the stable output clock fout when the input clock is switched compared with the related art.

Second Embodiment

Figure 4:
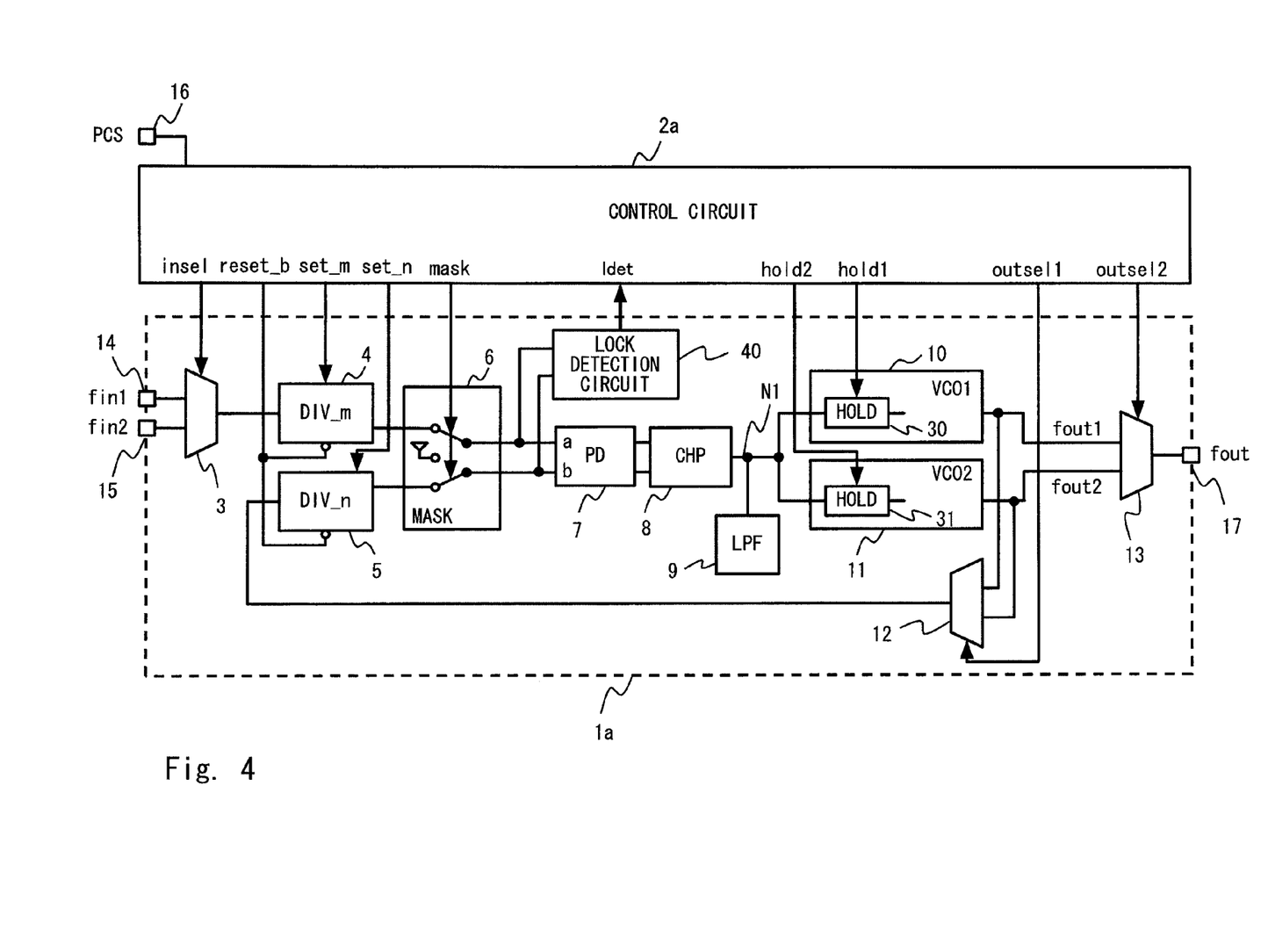
FIG. 4 is a block diagram showing a phase locked loop circuit according to a second embodiment of the present invention.

FIG. 4 shows a block diagram of a PLL circuit (phase locked loop circuit) 1a according to a second embodiment of the present invention. The PLL circuit 1a further includes a lock detection circuit 40 in addition to the elements of the PLL circuit 1 shown in FIG. 1. Further, a control circuit 2a is used instead of the control circuit 2.

The lock detection circuit 40 has one input terminal connected to one output terminal of the mask circuit 6 (output terminal of the NAND 20) and supplied with the inverting signal of the first frequency divided clock fa. The lock detection circuit 40 has the other input terminal connected to the other output terminal of the mask circuit 6 (output terminal of the NAND 21) and supplied with the inverting signal of the second frequency divided clock fb. Then, the lock detection circuit 40 generates a control signal Idet which is output to the control circuit 2a. The control circuit 2a outputs the control signal outsel2 according to the control signal Idet. The other circuit configurations are similar to those shown in the PLL circuit 1 shown in FIG. 1, and thus description will be omitted.

In the PLL circuit 1 shown in FIG. 1, the time required for the lock operation is unclear when the input clock is switched. Accordingly, in the PLL circuit 1 shown in FIG. 1, it is required to search the time required for the lock operation by a test or the like in advance, and to set the switching time of the output clock fout (time t10). On the other hand, in the PLL circuit 1a shown in FIG. 4, it is detected whether the first frequency divided clock fa and the second frequency divided clock fb are locked (synchronized) by the lock detection circuit 40. When they are locked, the selector 13 switches the output clock fout. Accordingly, the PLL circuit 1a shown in FIG. 4 is capable of switching the output clock fout more quickly and more accurately compared with the PLL circuit 1 shown in FIG. 1.

Figure 5:
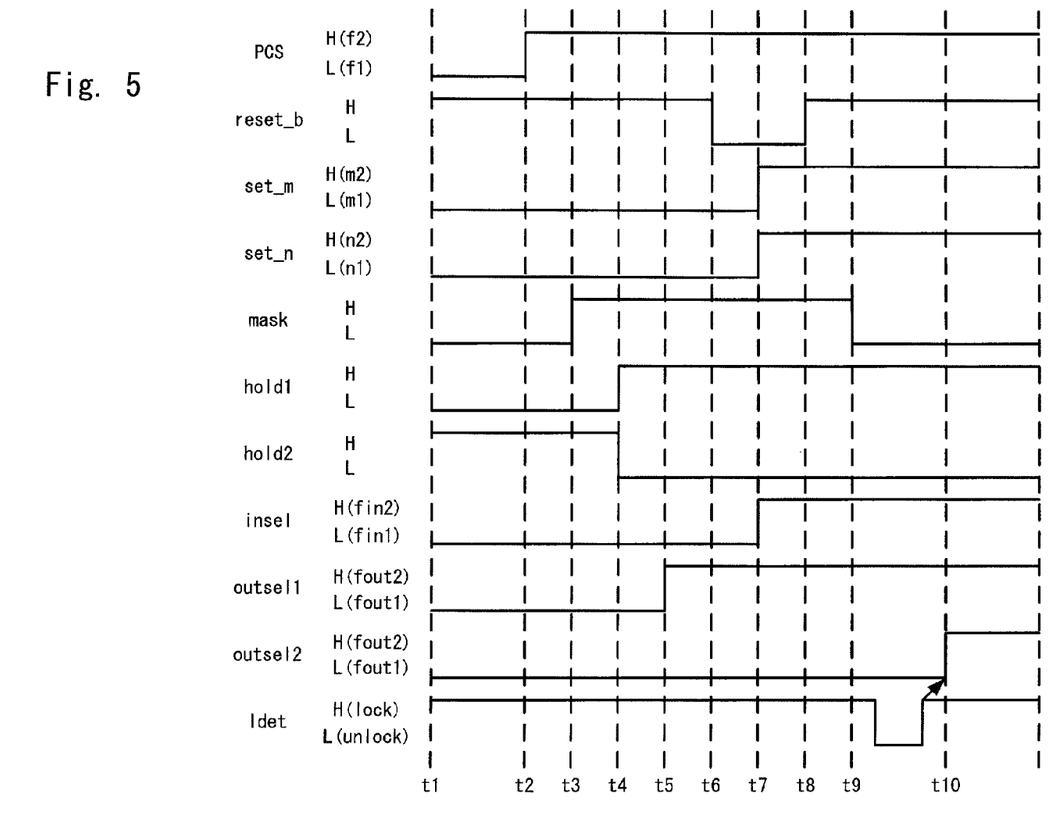
FIG. 5 is a timing chart showing an operation of the phase locked loop circuit according to the second embodiment of the present invention.

Specific operations of the PLL circuit 1a shown in FIG. 4 will be described with reference to a timing chart shown in FIG. 5. In the example of FIG. 5, description will be made of a case in which the clock used as the input clock is switched from the clock fin1 to the clock fin2. As shown in FIG. 5, the operations of the PLL circuit 1a from time t1 to time t9 are similar to those of the PLL circuit 1 shown in FIG. 1; hence overlapping description will be omitted.

At time t9, the control signal mask supplied from the control circuit 2a to the switch circuits 6a and 6b is changed from the high level (H) to the low level (L). At the same time, a clock obtained by inverting the first frequency divided clock fa is supplied to the input terminal a of the timing detection circuit 7. Further, a clock obtained by inverting the second frequency divided clock fb is supplied to the input terminal b of the timing detection circuit 7.

In this case, the lock detection circuit 40 detects the phase difference between the first frequency divided clock fa and the second frequency divided clock fb. In short, the lock detection circuit 40 detects whether the first frequency divided clock fa and the second frequency divided clock fb are locked. For example, when the first frequency divided clock fa and the second frequency divided clock fb are not locked, the lock detection circuit 40 outputs the low-level control signal Idet. On the other hand, when the first frequency divided clock fa and the second frequency divided clock fb are locked, the lock detection circuit 40 outputs the high-level control signal Idet. Accordingly, the lock detection circuit 40 outputs the low-level control signal Idet after time t9 and before completion of the lock operation. Then, the lock detection circuit 40 switches the control signal Idet from the low level to the high level after completion of the lock operation.

At time t10, upon switching of the control signal Idet to the high level, the control signal outsel2 supplied from the control circuit 2a to the selector 13 is changed from the low level to the high level. Hence, the selector 13 selects the output clock fout2 output from the voltage controlled oscillator 11, and outputs the output clock fout2 to the output port 17 as the output clock fout. In summary, the selector 13 outputs the output clock fout1 as the output clock fout before completion of the lock operation, and the selector 13 outputs the output clock fout2 as the output clock fout after completion of the lock operation. In other words, the selector 13 outputs the output clock fout2 as the output clock fout after the operation of the output clock fout2 is made stable. According to such a circuit configuration, the variation of the output clock fout2 based on the lock operation is not transferred to the output clock fout. Hence, the PLL circuit 1a is able to output the stable output clock fout with maintained desired frequency without being influenced by the variation of the output clock fout2 based on the lock operation. Furthermore, since the PLL circuit 1a is able to detect the completion of the lock operation by the lock detection circuit 40, the PLL circuit 1a is able to switch the output clock fout more quickly and more accurately.

The operation of switching the input clock from the clock fin2 to the clock fin1 is performed in the similar way as described above.

As stated above, the PLL circuit (phase locked loop circuit) according to the second embodiment includes two voltage controlled oscillators 10 and 11 having a voltage holding function. Then the PLL circuit according to the second embodiment outputs the output clock fout based on the input clock before switching (e.g., clock fin1) until when the lock operation is completed when switching the input clock, and switches the clock to the output clock fout based on the input clock after switching and outputs the output clock fout (e.g., clock fin2) after completion of the lock operation. Accordingly, the PLL circuit according to the second embodiment is capable of outputting the stable output clock fout with maintained desired frequency when the input clock is switched without being influenced by the lock operation.

Note that the present invention is not limited to the embodiments described above, but can be changed as appropriate without departing from the spirit of the present invention. Although the mask circuit 6 is included in the embodiments, it is not limited to this example. A circuit configuration including a timing detection circuit 7 that can be reset may be employed in place of the mask circuit 6. In this case, when the input clock is switched, the timing detection circuit 7 is set to the reset state, and the first timing signal and the second timing signal output from the timing detection circuit 7 are set so that the current is not generated in the charge pump 8. Hence, the similar effect as the embodiments described above can be achieved.

A circuit configuration that does not include the mask circuit 6 may be employed, although this may increase the time required for the re-lock. Preferably, when the input clock is switched, the 1/m frequency divider 4 and the 1/n frequency divider 5 are set to the reset state, and the voltage input to the input terminal a and the input terminal b of the timing detection circuit 7 is set to the high level. Accordingly, the first timing signal and the second timing signal output from the timing detection circuit 7 are set so that the current is not generated in the charge pump 8. Accordingly, the same effect as the embodiments described above may be achieved.

Further, the timing of resetting the 1/m frequency divider 4 and the 1/n frequency divider 5 is not necessarily performed at the same time as the switch of the selection of the clock by the selector 3.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A phase locked loop circuit comprising:
   a selector that selects one of a plurality of clocks as an input clock;
   a first frequency divider that divides a frequency of the input clock;
   a second frequency divider that divides a frequency of a feedback clock;
   a phase difference detector that detects a phase difference between the clock divided by the first frequency divider and the clock divided by the second frequency divider;
   a first voltage controlled oscillator that comprises a first voltage holding circuit holding an input voltage according to the phase difference, the first voltage controlled oscillator generating a first intermediate clock based on the input voltage according to the phase difference detected by the phase difference detector in a normal mode, the first voltage controlled oscillator generating the first intermediate clock based on the input voltage held in the first voltage holding circuit in a holding mode;
   a second voltage controlled oscillator that comprises a second voltage holding circuit holding an input voltage according to the phase difference, the second voltage controlled oscillator generating a second intermediate clock based on the input voltage according to the phase difference detected by the phase difference detector in the normal mode, the second voltage controlled oscillator generating the second intermediate clock based on the input voltage held in the second voltage holding circuit in the holding mode; and
   a selection circuit that selects one of the first and second intermediate clocks, and outputs the selected clock as an output clock and the feedback clock,
   wherein the clock selected as the input clock is switched by the selector when the intermediate clock generated by the voltage controlled oscillator in the holding mode among the first and second intermediate clocks is output as the output clock and the intermediate clock generated by the voltage controlled oscillator in the normal mode is output as the feedback clock, and
   wherein the phase difference detector comprises:
      a timing detection circuit that inputs the clock divided by the first frequency divider to output a first timing signal, and inputs the clock divided by the second frequency divider to output a second timing signal; and
      a charge pump circuit that generates a phase difference current according to the phase difference between the clock divided by the first frequency divider and the clock divided by the second frequency divider based on the first timing signal and the second timing signal.

2. The phase locked loop circuit according to claim 1, wherein the intermediate clock selected as the output clock is switched by the selection circuit when the feedback clock and the input clock after switching are synchronized with each other.

3. The phase locked loop circuit according to claim 1, wherein when the clock selected as the input clock is switched, the corresponding voltage controlled oscillator is set to the holding mode in advance.

4. The phase locked loop circuit according to claim 1, further comprising a low-pass filter that is connected in parallel to a node between the phase difference detector and the first and second voltage controlled oscillators.

5. The phase locked loop circuit according to claim 1, wherein the timing detection circuit outputs the first and second timing signals each having a predetermined voltage when the timing detection circuit is set to a reset state.

6. The phase locked loop circuit according to claim 1, further comprising a mask circuit that selects one of the clock divided by the first frequency divider and the clock divided by the second frequency divider and a pair of predetermined voltages, and outputs the selected one to the phase difference detector.

7. The phase locked loop circuit according to claim 1, wherein the first and second frequency dividers each output a predetermined voltage when the first and second frequency dividers are set to a reset state.

8. The phase locked loop circuit according to claim 5, wherein the first and second voltage holding circuits each hold the input voltage generated based on the predetermined voltage in the holding mode.

9. The phase locked loop circuit according to claim 1, further comprising a lock detection circuit that detects whether the input clock and the feedback clock are synchronized with each other,
- wherein the intermediate clock that is selected as the output clock is switched by the selection circuit based on the detection result detected by the lock detection circuit.

10. A control method of a phase locked loop circuit, the phase locked loop circuit comprising:
- a selector that selects one of a plurality of clocks as an input clock;
- a first frequency divider that divides a frequency of the input clock;
- a second frequency divider that divides a frequency of a feedback clock;
- a phase difference detector that detects a phase difference between the clock divided by the first frequency divider and the clock divided by the second frequency divider, the phase difference detector comprising:
  - a timing detection circuit that inputs the clock divided by the first frequency divider to output a first timing signal, and inputs the clock divided by the second frequency divider to output a second timing signal; and
  - a charge pump circuit that generates a phase difference current according to the phase difference between the clock divided by the first frequency divider and the clock divided by the second frequency divider based on the first timing signal and the second timing signal;
- a first voltage controlled oscillator that comprises a first voltage holding circuit holding an input voltage according to the phase difference, the first voltage controlled oscillator generating a first intermediate clock based on the input voltage according to the phase difference detected by the phase difference detector in a normal mode, the first voltage controlled oscillator generating the first intermediate clock based on the input voltage held in the first voltage holding circuit in a holding mode;
- a second voltage controlled oscillator that comprises a second voltage holding circuit holding an input voltage according to the phase difference, the second voltage controlled oscillator generating a second intermediate clock based on the input voltage according to the phase difference detected by the phase difference detector in the normal mode, the second voltage controlled oscillator generating the second intermediate clock based on the input voltage held in the second voltage holding circuit in the holding mode; and
- a selection circuit that selects one of the first and second intermediate clocks, and outputs the selected clock as an output clock and the feedback clock, the control method comprising:
- outputting the intermediate clock generated by the voltage controlled oscillator in the holding mode among the first and second intermediate clocks as the output clock;
- outputting the intermediate clock generated by the voltage controlled oscillator in the normal mode as the feedback clock; and
- switching the clock selected as the input clock by the selector.

11. The control method of the phase locked loop circuit according to claim 10, comprising switching the intermediate clock selected as the output clock by the selection circuit when the feedback clock and the input clock after switching are synchronized with each other.

12. The control method of the phase locked loop circuit according to claim 10, comprising setting the corresponding voltage controlled oscillator to the holding mode in advance when the clock selected as the input clock is switched.

* * * * *